(12) United States Patent
Simon

(10) Patent No.: US 8,914,258 B2
(45) Date of Patent: Dec. 16, 2014

(54) RF FEED ELEMENT DESIGN OPTIMIZATION USING SECONDARY PATTERN

(75) Inventor: Peter S. Simon, Camarillo, CA (US)

(73) Assignee: Space Systems/Loral, LLC, Palo Alto, CA (US)

( * ) Notice: Subject to any disclaimer, the term of this patent is extended or adjusted under 35 U.S.C. 154(b) by 649 days.

(21) Appl. No.: 13/170,813

(22) Filed: Jun. 28, 2011

(65) Prior Publication Data

US 2013/0006585 A1 Jan. 3, 2013

(51) Int. Cl.
*G06F 17/50* (2006.01)
*H01Q 13/02* (2006.01)
*G06K 7/00* (2006.01)

(52) U.S. Cl.
CPC ........ *G06F 17/5018* (2013.01); *H01Q 13/0208* (2013.01); *G06K 7/00* (2013.01)
USPC ..................... 703/1; 703/2; 343/817; 343/834

(58) Field of Classification Search
None
See application file for complete search history.

(56) References Cited

U.S. PATENT DOCUMENTS

| | | | | |
|---|---|---|---|---|
| 5,502,447 | A * | 3/1996 | Kumpfbeck et al. | ......... 342/373 |
| 5,546,097 | A | 8/1996 | Ramanujam et al. | |
| 5,714,961 | A * | 2/1998 | Kot et al. | ....................... 343/769 |
| 5,721,554 | A * | 2/1998 | Hall et al. | ....................... 342/165 |
| 5,889,906 | A * | 3/1999 | Chen | ............................... 385/28 |
| 6,384,795 | B1 | 5/2002 | Bhattacharyya et al. | |
| 6,396,453 | B2 | 5/2002 | Amyotte et al. | |
| 6,463,282 | B2 | 10/2002 | Norin et al. | |
| 6,919,855 | B2 * | 7/2005 | Hills | ...................... 343/781 CA |
| 6,977,622 | B2 | 12/2005 | Hay et al. | |
| 7,081,863 | B2 * | 7/2006 | Inasawa et al. | ........ 343/781 CA |
| 7,183,991 | B2 | 2/2007 | Bhattacharyya et al. | |
| 7,242,904 | B2 | 7/2007 | Rao et al. | |
| 7,254,365 | B2 * | 8/2007 | Chen | ............................ 455/13.3 |
| 7,668,373 | B2 * | 2/2010 | Mitsui | ............................ 382/181 |
| 7,817,967 | B2 * | 10/2010 | Karabinis et al. | ............. 455/101 |
| 8,102,324 | B2 * | 1/2012 | Tuau et al. | .................. 343/781 P |
| 8,253,626 | B2 * | 8/2012 | Schantz et al. | ................. 342/450 |

(Continued)

OTHER PUBLICATIONS

K. K. Chan and S. K. Rao, "Design of High Efficiency Circular Horn Feeds for Multibeam Reflector Applications", pp. 253-258, Jan. 2008.*

(Continued)

*Primary Examiner* — Omar Fernandez Rivas
*Assistant Examiner* — Kibrom K Gebresilassie
(74) *Attorney, Agent, or Firm* — Weaver Austin Villeneuve & Sampson LLP

(57) ABSTRACT

An RF feed element for an antenna system required to comply with a set of specified secondary pattern characteristics is designed by performing a quantitative optimization of the RF feed element directly with respect to the secondary pattern characteristics. The quantitative optimization may include pre-computing a plurality of partial secondary pattern complex field values. Each partial secondary pattern may be associated with an RF feed element modal beamlet. A value of at least one to-be-optimized feature is optimized by iteratively adjusting the value of the to-be-optimized feature(s) within an optimization loop that iteratively computes secondary pattern characteristics and compares them to the specified secondary pattern characteristics. The computed secondary pattern characteristics result from performing a linear superposition on the pre-computed partial secondary pattern complex field values, using complex modal coefficients of the RF feed element, determined taking into account current value(s) of the to-be-optimized feature(s).

25 Claims, 5 Drawing Sheets

(56) References Cited

U.S. PATENT DOCUMENTS

| | | | |
|---|---|---|---|
| 8,581,795 B2* | 11/2013 | Simms et al. | 343/781 CA |
| 8,593,353 B2* | 11/2013 | Byun et al. | 343/702 |
| 2003/0151558 A1* | 8/2003 | Inasawa et al. | 343/766 |
| 2005/0093752 A1* | 5/2005 | Cheng et al. | 343/702 |
| 2006/0001588 A1* | 1/2006 | Inasawa et al. | 343/781 P |
| 2006/0023933 A1* | 2/2006 | Mitsui | 382/145 |
| 2006/0125706 A1 | 6/2006 | Amyotte et al. | |
| 2006/0267839 A1* | 11/2006 | Vaskelainen et al. | 342/368 |
| 2007/0126586 A1* | 6/2007 | Ohtaka | 340/572.7 |
| 2007/0143733 A1* | 6/2007 | Zach et al. | 716/19 |
| 2007/0236571 A1* | 10/2007 | Lee | 348/192 |
| 2009/0280742 A1* | 11/2009 | Schantz et al. | 455/41.1 |
| 2009/0323652 A1* | 12/2009 | Chen et al. | 370/338 |
| 2010/0295743 A1* | 11/2010 | Pu et al. | 343/749 |
| 2011/0208474 A1* | 8/2011 | Tanabiki et al. | 702/150 |
| 2011/0291903 A1* | 12/2011 | Shea et al. | 343/779 |
| 2011/0309987 A1* | 12/2011 | Haluba et al. | 343/755 |
| 2012/0065945 A1* | 3/2012 | Brown et al. | 703/1 |
| 2012/0065946 A1* | 3/2012 | Brown et al. | 703/1 |
| 2012/0331436 A1* | 12/2012 | Formato | 716/132 |
| 2014/0104128 A1* | 4/2014 | PU et al. | 343/848 |

OTHER PUBLICATIONS

J. Migl, W. Lindemer, and W. Wogurek, "Low Cost Satellite Payload Measurement System" pp. 1-6, 2005.*

Cleaveland, B., "Secondary Element Patterns of Array-Fed Imaging Reflectors and Their Use for Optimization of Scanned Pencil Beams", Antennas and Propagation Society International Symposium, Ann Arbor, MI, AP-S, Digest, Jun. 28-Jul. 2, 1993, vol. 3, pp. 1655-1658.

Chan, Kwok Kee, et al., "Design of High Efficiency Circular Horn Feeds for Multibeam Reflector Applications", IEEE Transactions on Antennas and Propagation, vol. 56, No. 1, Jan. 2008, 6 pages.

Villa, F., "High Performance Corrugated Feed Horns for Space Applications At Millimetre Wavelengths", Experimental Astronomy 14: 2002, pp. 1-15.

Deguchi, Hiroyuki, "Compact Low-Cross-Polarization Horn Antennas With Serpentine-Shaped Taper", IEEE Transactions on Antennas and Propagation, vol. 52, No. 10, Oct. 2004, pp. 2510-2516.

Dubrovka, et al, "Recent Progress in Development of Multiband Feed Horns (Review)", International Conference on Antenna Theory and Techniques, Sep. 17-21, 2007, Sevastopol, Ukraine, pp. 44-50.

European Space Agency, "Telecommunication and Tracking Multi-Mode Horn Design Optimization Software, MDA Project Objectives", [online] [retrieved on Mar. 17, 2011] Retrieved from http://telecom.esa.int/www/object/printfriendly.cfm?fobjectid=28205, 4 pages.

* cited by examiner

FIG. 1—PRIOR ART

RF FEED ELEMENT DESIGN OPTIMIZATION USING SECONDARY PATTERN

TECHNICAL FIELD

This invention relates generally to antenna systems in which a radio frequency (RF) feed element illuminates an antenna reflector, and more particularly to optimizing an RF feed element design using secondary pattern characteristics of the antenna reflector.

BACKGROUND OF THE INVENTION

Antenna systems consisting of an antenna reflector illuminated, directly or indirectly, by one or more RF feed elements are commonly used in equipment for terrestrial and satellite based communications. RF power emitted (or received) by the RF feed is reflected and concentrated by the antenna reflector to (from) a distant receiver (transmitter). The performance of such an antenna system may be specified in terms of the so-called "secondary" pattern characteristics of the antenna reflector, as exhibited, for example, at a remote target. Secondary pattern characteristics may be specified in terms of effective isotropic radiated power (EIRP), gain to noise temperature ratio (G/T), ratio of desired polarization/cross polarization (C/X), far field amplitude, edge of coverage directivity, coverage and suppression (isolation) regions, and cross polarization and co-polarization roll-off.

An important contributor to achieving a specified set of secondary pattern characteristics, are the output characteristics—so-called "primary" pattern characteristics of the RF feed element. Primary pattern characteristics include, for example, aperture efficiency, edge taper, polarization purity, cross polarization level, phase center variation with frequency, and spillover loss. Primary pattern characteristics of the RF feed element may be varied by varying RF feed element design parameters, including, where the RF feed element is a horn, for example, aperture size, length, internal profile, number, size, and placement of horn corrugations, steps, and/or tapers, and size of input waveguide.

Mathematical modeling of the secondary pattern characteristics that result from an antenna reflector being illuminated by an RF feed element having a particular set of primary pattern characteristics is computationally very demanding, at least for antenna systems of commercial interest. As a result, quantitative optimization of RF feed element design parameters with respect to secondary pattern characteristics has proven to be impractical. Instead, antenna system designers conventionally rely on engineering judgment and experience to first specify primary pattern characteristics that are considered necessary to achieve the specified secondary pattern characteristics, and then optimize the RF feed element design parameters with respect to the specified primary pattern characteristics.

For example, referring now to FIG. 1, the conventional design procedure begins with specifying the desired secondary pattern characteristics 101, followed by selection of the reflector optics 102. Selection of reflector optics 102 may include choosing a reflector system configuration, (for example, selecting a single offset reflector or a dual-reflector configuration), along with other choices such as focal length(s), reflector diameter(s), offsets, shaping of reflector surfaces, etc. Specifying primary pattern characteristics 103, may include specifying, for example, phase center variation with frequency, cross polarization level, spillover loss, edge taper. Conventionally, primary pattern characteristics are specified based on engineering judgment that illumination of the reflector system by a feed element compliant with the specified primary pattern characteristics will produce a secondary pattern that at least complies with the specified secondary pattern characteristics. An initial selection 104 is made for the parameters of the feed element, which may include, for example, one or more of: aperture size, length, horn profile, number, size, and placement of corrugations, steps, and/or tapers, size of input waveguide exciting the feed, and possibly others. The design process then enters an iterative optimization loop 105, 106, 107, 108, wherein the primary pattern properties obtained for a given set of feed element parameters are computed and compared to the desired properties. The selected parameters of the feed are adjusted within this loop until a variance (the "first variance") between achieved and specified primary pattern properties is made sufficiently small. When the first variance is acceptably small, the relatively expensive computation of secondary pattern characteristics may be performed 109. Determination 110 of a variance (the "second variance") between achieved and desired secondary pattern characteristics is then performed, and a decision 113 is reached as to whether the variance is sufficiently small. If not, the cause must be that the initial choice 103 of primary pattern characteristics was not appropriate, and an adjustment 111 of these characteristics implemented. The feed parameter optimization loop 105, 106, 107, and 108 is then reentered and the process is repeated until convergence on the desired secondary pattern characteristics is achieved.

Results of the foregoing conventional methodology, as measured both in terms of cost and duration of the process, as well as quality of the delivered design, are highly dependent on the quality of the engineering judgment applied to initially specifying the primary pattern characteristics. Expensive redesign and reanalysis and/or sub-optimal antenna system performance are inherent risks of such a design methodology.

Thus, there is a need for more efficient and reliable methods for designing an RF feed element.

SUMMARY OF INVENTION

The present inventor has recognized that, for an antenna system required to meet a plurality of specified secondary pattern characteristics, an RF feed element may be advantageously designed by performing a quantitative optimization of the RF feed element design directly with respect to the specified secondary pattern characteristics. Using the techniques described below, an antenna system designer may specify the desired properties of the secondary pattern of the antenna system's reflector, after which RF feed element properties are automatically generated to best meet the required performance. Advantageously, primary pattern properties of the RF feed element may be largely disregarded. Instead, the RF feed element properties are optimized directly with respect to the desired secondary pattern characteristics.

The quantitative optimization may be advantageously performed by pre-computing and storing, using a selected optical geometry of an antenna reflector and a selected first geometric property of the RF feed element, a plurality of partial secondary pattern complex field values. Each partial secondary pattern (or "modal beamlet") is associated with an individual RF feed element mode. In an embodiment, a value of at least one additional feature of the RF feed element (the "to-be-optimized feature"), other than the selected first geometric property, is optimized by iteratively adjusting the value of the to-be-optimized feature(s) within an optimization loop. The optimization loop may include: (i) determining a cost for a current value of the to-be-optimized feature, said cost resulting at least in part from a variance between a plurality of computed secondary pattern characteristics and the plurality of specified secondary pattern characteristics; (ii) determining, when the cost is not greater than a specified value, that the second feature is sufficiently optimized, and, when the cost is greater than the specified value, adjusting the current value of the to-be-optimized feature and repeating steps (i) and (ii).

The computed secondary pattern characteristics may be determined from performing a linear superposition on the stored, pre-computed, plurality of partial secondary pattern complex field values, using modal expansion coefficients of the RF feed element, where the modal expansion coefficients are determined taking into account current value(s) of the to-be-optimized feature(s).

In an embodiment, an antenna system is designed to comply with a plurality of specified secondary pattern characteristics, the antenna system including an RF feed element and a reflector, the RF feed element characterized by a first geometric feature, and configured to exhibit a plurality of primary pattern characteristics by: computing a plurality of partial secondary pattern complex field values for the reflector, each partial secondary pattern characteristic being associated with an individual RF feed element mode; storing the computed plurality of partial secondary pattern characteristics; optimizing a value of at least a second, to-be-optimized, feature of the RF feed element, other than the selected first geometric feature, by executing, on a processor, at least two cycles of an optimization loop, the optimization loop comprising: (i) determining a cost for a current value of the to-be-optimized feature, said cost resulting at least in part from a variance between a plurality of computed secondary pattern characteristics and the plurality of specified secondary pattern characteristics; and, (ii) determining, when the cost is not greater than a specified value, that the second feature is sufficiently optimized, and, when the cost is greater than the specified value, adjusting the current value of the to-be-optimized feature and repeating steps (i) and (ii). The computed secondary pattern characteristics may be computed by performing a linear superposition on the stored computed plurality of partial secondary pattern complex field values, the linear superposition being performed using a set of complex modal coefficients of the RF feed element determined, for a selected number of radiating modes, taking into account the current value of the to-be-optimized feature.

In a further embodiment, the set of complex modal coefficients of the RF feed element are determined by performing an analysis of electromagnetic properties of the RF feed element. The analysis may comprise at least one of: method of moments (MoM), finite difference time domain (FDTD), finite difference frequency domain (FDFD), finite elements (FE), and mode matching.

In an embodiment, the RF feed element is a horn. The horn may have a longitudinal axis and a cross section of the horn may be axially symmetric. The first geometric feature may be a dimension of an aperture of the horn.

In a further embodiment, the reflector has a known set of optical properties including at least one of a number of reflecting surfaces and a type of reflecting surface.

In another embodiment, computing a plurality of partial secondary pattern characteristics includes: selecting a set of optimization stations at locations within the secondary pattern coverage area of interest; and computing, for each of the selected number of aperture modes, and at each optimization station, a respective partial secondary pattern, the computing step assuming a radiation pattern emitted from the RF feed element resulting only from excitation of a single respective mode. The selected number of aperture modes may include substantially all propagating modes and at least one additional, cutoff, mode.

In an embodiment, the selected number of aperture modes includes approximately twenty cutoff modes.

In a further embodiment, computing a plurality of partial secondary pattern characteristics includes integrating physical optics currents induced on a surface of the reflector. Computing a respective partial secondary pattern may include using at least one of: geometrical optics, physical optics, geometrical theory of diffraction (GTD) and physical theory of diffraction (PTD)

In an embodiment, each optimization station has a respective specification of at least one desired pattern characteristic.

In another embodiment, the computing step assumes a radiation pattern emitted from the RF feed element resulting only from excitation, with a unit excitation amplitude, of a respective single mode.

In an embodiment, the specified secondary pattern characteristics are selected from the group consisting of: effective isotropic radiated power (EIRP), gain to noise temperature ratio (G/T), edge of coverage directivity, sidelobe suppression, polarization, far field amplitude, polarization purity, ratio of desired polarization/cross polarization (C/X), and cross polarization and co-polarization roll-off.

In another embodiment, optimizing a value of the at least a second, to-be-optimized, feature of the RF feed element comprises executing, on the processor, at least one thousand cycles of the optimization loop.

In a further embodiment, the cost results from a weighted sum of (i) the variance between the plurality of computed secondary pattern characteristics and the specified secondary pattern characteristics and (ii) a variance of at least one other property of the resulting feed geometry from a desired value. The at least one other property may include at least one of feed return loss, physical length, and another property of interest that depends on the to-be-optimized feature.

In an embodiment, an antenna system has an RF feed element and a reflector, the RF feed element characterized by a first geometric feature, and configured to exhibit a plurality of primary pattern characteristics. The antenna system is required to comply with a plurality of specified secondary pattern characteristics, and a design feature of the RF feed element results from performing a quantitative optimization directly with respect to the specified secondary pattern characteristics.

BRIEF DESCRIPTION OF THE DRAWINGS

Features of the invention are more fully disclosed in the following detailed description of the preferred embodiments, reference being had to the accompanying drawings, in which.

Figure 1:
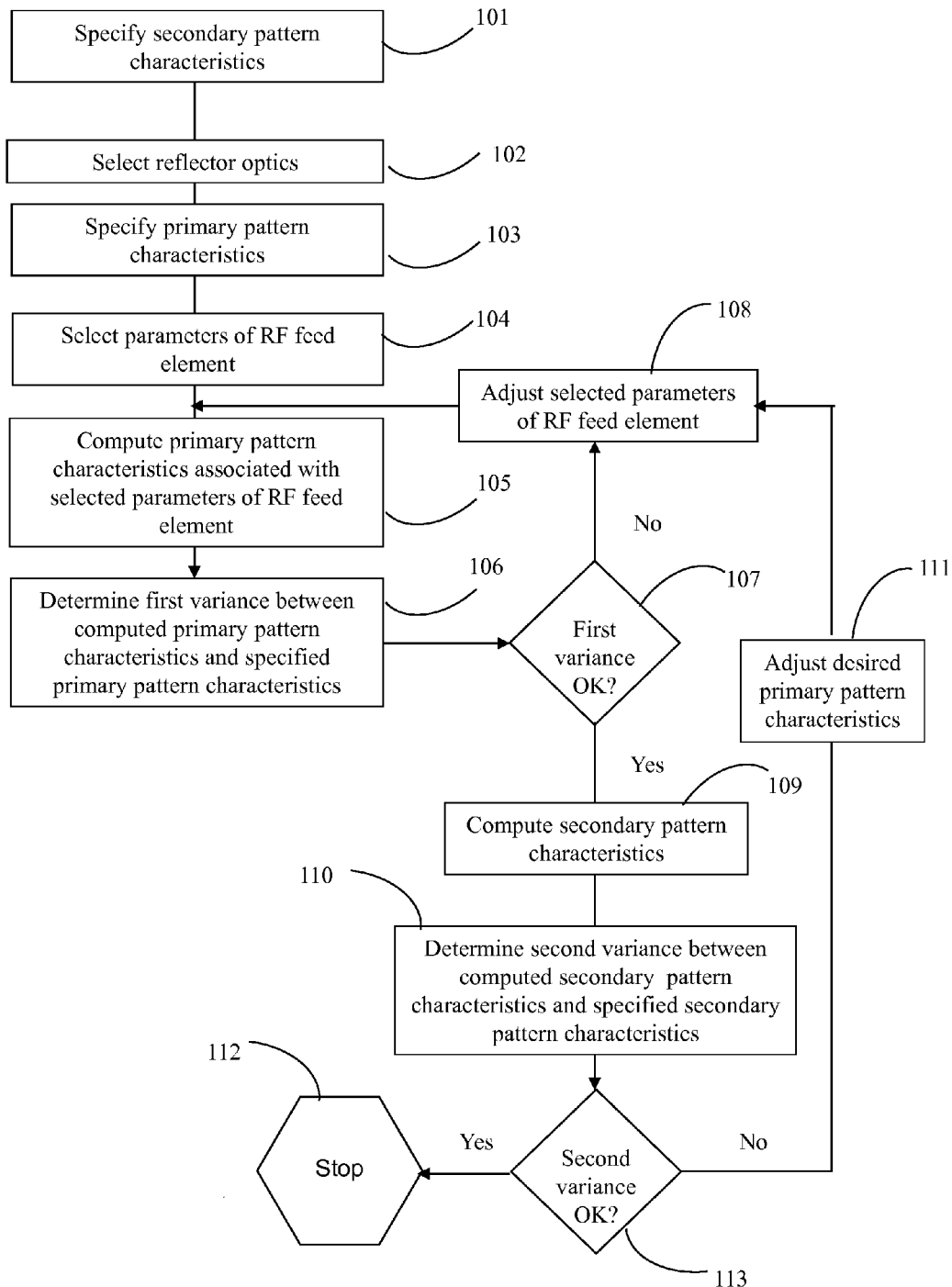
FIG. 1 illustrates a method of antenna system design according to the prior art.

Throughout the drawings, the same reference numerals and characters, unless otherwise stated, are used to denote like features, elements, components, or portions of the illustrated embodiments. Moreover, while the subject invention will now be described in detail with reference to the drawings, the description is done in connection with the illustrative embodiments. It is intended that changes and modifications can be made to the described embodiments without departing from the true scope and spirit of the subject invention as defined by the appended claims.

DETAILED DESCRIPTION

Specific exemplary embodiments of the invention will now be described with reference to the accompanying drawings. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that although the terms "first" and "second" are used herein to describe various elements, these elements should not be limited by these terms. These terms are used only to distinguish one element from another element. Thus, for example, a first user terminal could be termed a second user terminal, and similarly, a second user terminal may be termed a first user terminal without departing from the teachings of the present invention. As used herein, the term "and/or" includes any and all combinations of one or more of the associated listed items. The symbol "/" is also used as a shorthand notation for "and/or".

The terms "spacecraft", "satellite" and "vehicle" may be used interchangeably herein, and generally refer to any orbiting satellite or spacecraft system.

Figure 2:
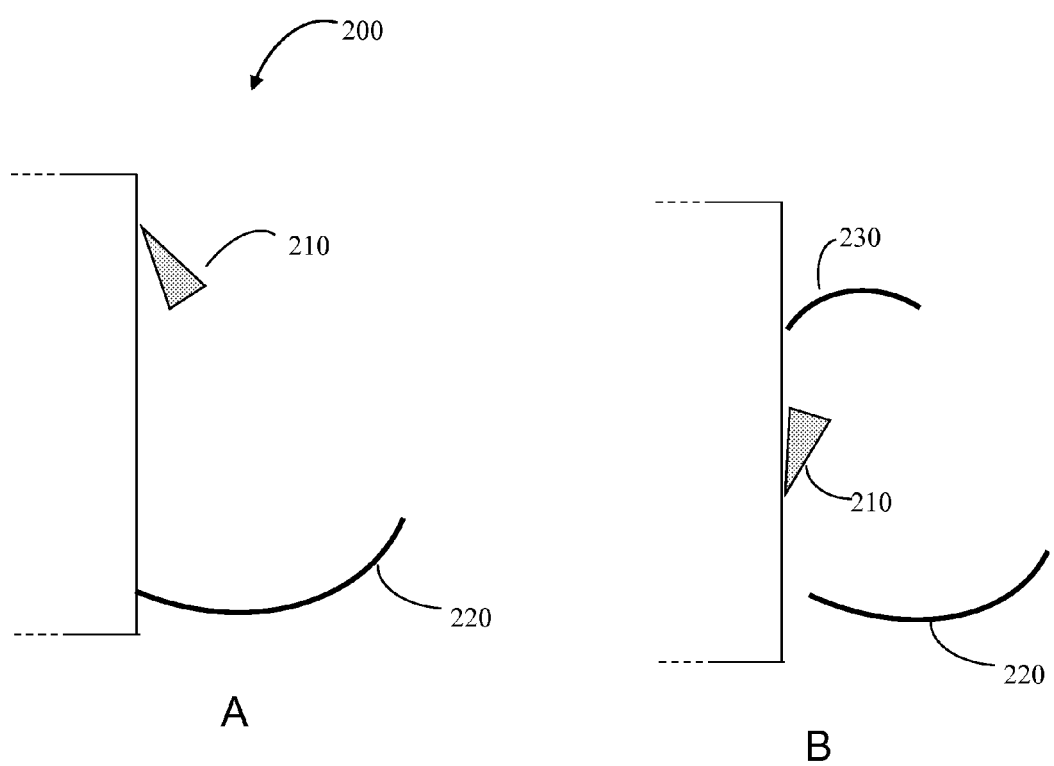
FIG. 2 illustrates examples of antenna system designs.

In an embodiment, a method for designing an antenna system is provided. Referring now to FIG. 2, antenna system 200 may includes at least one RF feed element 210 and at least one reflector 220, illuminated by RF feed element 210. RF feed element 210 may exhibit a number of associated primary pattern characteristics whereas reflector 220, upon being illuminated by RF feed element 210, may exhibit a number of associated secondary pattern characteristics. RF feed element 210 may illuminate reflector 220 directly, as illustrated in FIG. 2A. In some embodiments, however, one or more subreflectors or splash plates may be disposed between the RF feed element and a (main) reflector. For example, referring now to FIG. 2B, subreflector 230 may be disposed between RF feed element 210 and reflector 220.

In an embodiment, for an antenna system required to meet a plurality of specified secondary pattern characteristics, an RF feed element may be designed by performing a quantitative optimization of the RF feed element design directly with respect to the specified secondary pattern characteristics.

Figure 3:
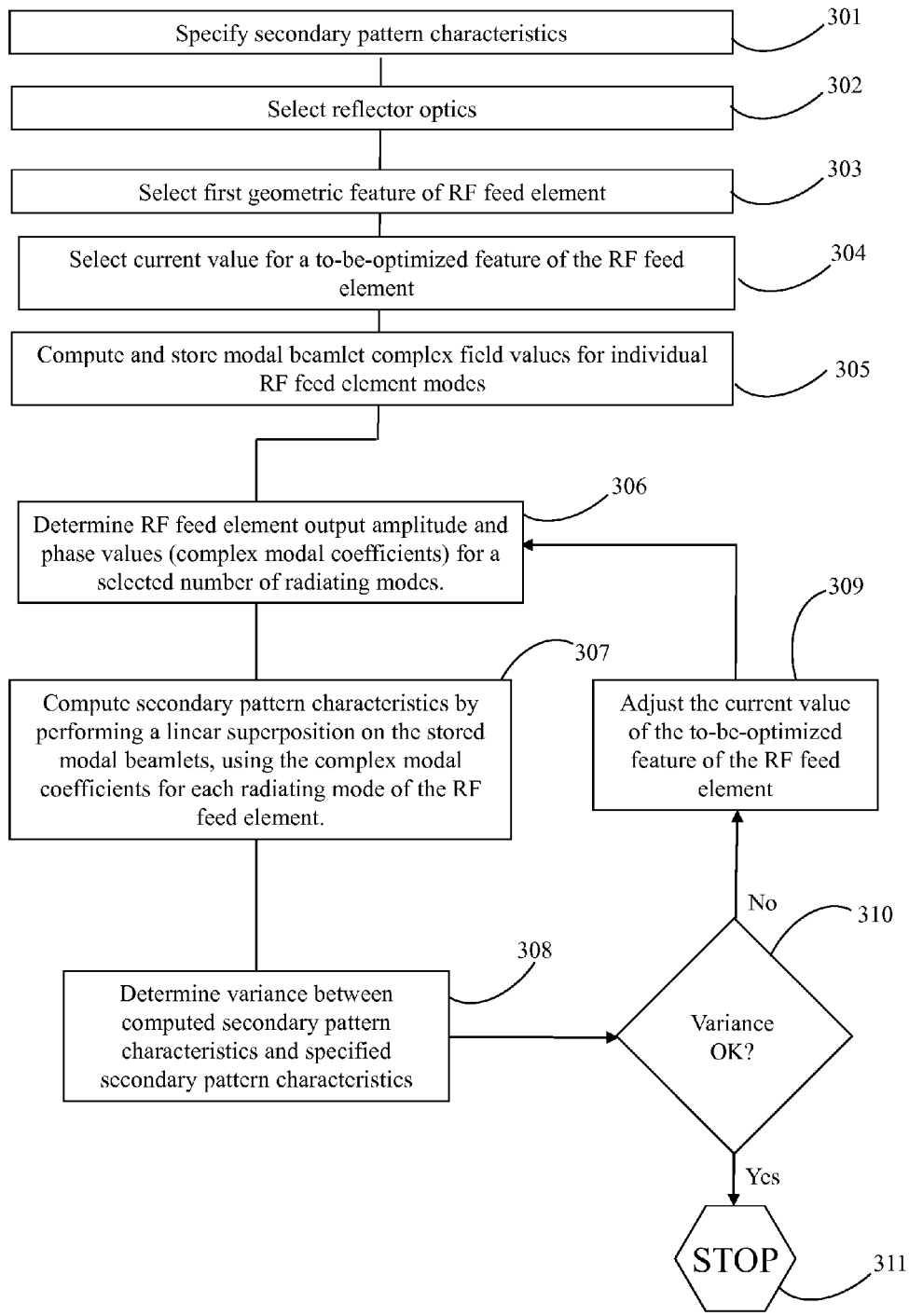
FIG. 3 illustrates an embodiment of a method of antenna system design according to the present teachings.

Referring now to FIG. 3, in an embodiment, at block 301, secondary pattern characteristics are specified. The specified secondary pattern characteristics may result, for example, from a customer or system specification, and/or may represent desired performance characteristics from the antenna system. The specified secondary pattern characteristics may include, for example, effective isotropic radiated power (EIRP), gain to noise temperature ratio (G/T), ratio of desired polarization/cross polarization (C/X), far field amplitude, edge of coverage directivity, coverage and suppression (isolation) regions, and cross polarization and co-polarization roll-off at various locations within a secondary pattern coverage area of interest.

Reflector optics may be selected, block 302. For example, an antenna reflector shape, diameter, focal length, surface material properties and the like may be selected. Moreover, a particular set of optical properties of the antenna reflector may be selected, including, for example, choice of a number of reflecting surfaces (for example, single or dual-reflector configurations) and a type of reflecting surface.

A first geometric feature of the RF feed element may be selected, block 303. The first geometric feature of the RF feed element may, in an embodiment, be an aperture of a feed element configured as a horn, but other geometric features are within the contemplation of the inventor, including, for example, a shape or size of a topmost layer metallic patch for an aperture-coupled microstrip radiating feed element.

A current value for a to-be-optimized feature of the RF feed element may be selected, block 304. More than one feature may be optimized. Features advantageously optimized by the presently disclosed techniques include geometric features such as, for example a size of input waveguide exciting the feed, and, where the RF feed element is a horn, horn aperture size, length, and profile, and number, size, and placement of corrugations, steps, and/or tapers. Non-geometric features, such as, for example, RF feed element surface electrical properties may also be optimized by the techniques described herein.

Advantageously, a set of complex field values for each modal beamlet may be precomputed and stored, block 305, for each of a selected number of individual RF feed element modes. The selected number of modal beamlets may be determined, for example, by selecting all propagating modes supported by a horn aperture, and some number of additional cutoff modes. In an embodiment, for example, twenty additional cutoff modes may be selected. In an embodiment, a set of "optimization stations", at locations within the secondary pattern coverage area of interest, may be selected. The optimization stations may be a set of points $(u_1, v_1)$, $(u_2, v_2)$, ..., $(u_N, v_N)$, where 'u' and 'v' are direction cosines, so that these points represent directions in space relative to, for example, the reflector boresight direction. Each optimization station may have, associated with it, information describing the desired pattern characteristics at that location. For example the desired pattern characteristics may be described in terms of: desired polarization, field amplitude value, polarization purity, axial ratio, or other pattern characteristic of interest.

In an embodiment, for each modal beamlet, complex field values may be computed for each optimization station location. Advantageously, the computation assumes illumination of the reflector by a radiation pattern of the RF feed element with only a single mode excited with unit amplitude. The computation may, for example be based on use of geometrical optics, physical optics, geometrical theory of diffraction (GTD), physical theory of diffraction (PTD), or other techniques. Advantageously, the computation results, for each modal beamlet and for each of the station locations, are stored for later reuse.

In an embodiment, computing the partial secondary pattern characteristics may include selecting a set of optimization stations at locations within the secondary pattern coverage area of interest, and computing, for each of the selected number of aperture modes, and at each optimization station, a respective partial secondary pattern. In an embodiment, each optimization station has a respective specification of at least one desired pattern characteristic. Advantageously, the computing step may assume that a radiation pattern emitted from the RF feed element results only from excitation of a single respective mode. In an embodiment, the selected number of aperture modes may include substantially all propagating modes and, advantageously, at least one additional, cutoff, mode. In an embodiment, the selected number of aperture modes includes approximately twenty cutoff modes.

In an embodiment, computing a plurality of partial secondary pattern characteristics includes integrating physical optics currents induced on a surface of the reflector.

Referring still to FIG. 3, RF feed element output amplitude and phase values and/or associated modal expansion coefficients, may be determined for a selected number of radiating modes, block 306. For the selected first geometric feature of the RF feed element, and current value(s) of the to-be-optimized feature(s), output characteristics of the RF feed element may be found from analysis of electromagnetic properties of the RF feed element. The analysis may be performed using various computational techniques known in the art, including, for example: method of moments (MoM), finite difference time domain (FDTD), finite difference frequency domain (FDFD), finite elements (FE), or, advantageously, mode matching. The result of a mode matching analysis, for example, may include the set of mode amplitudes and phases actually present, for example, at the aperture of the feed horn, along with the input return loss of the feed horn.

Secondary pattern characteristics may be computed, block 307, using RF feed element output amplitude and phase values (or, equivalently, complex modal coefficients) for a selected number of radiating modes. Advantageously, pattern characteristics may be computed by performing a linear superposition on the modal beamlets (computed and stored at block 305), using the modal expansion coefficients for each radiating mode of the RF feed element. Thus, secondary pattern characteristics may be computed by summing the beamlet contributions, a relatively low-cost computation. The computed secondary pattern characteristics may represent the total fields present at the optimization stations due to radiation from the RF feed element under consideration illuminating the reflector system.

An overall figure of merit (referred to herein as a "cost") may be determined, block 308, where the cost results, at least in part, from a variance between the computed secondary pattern characteristics and the specified secondary pattern characteristics.

Advantageously, the cost may be determined based on a weighted sum of (i) the variance between the computed secondary pattern characteristics and the specified secondary pattern characteristics and (ii) variances of other properties of the resulting feed geometry from their desired values. Such properties might include, for example, feed return loss, physical length, and other properties of interest that depend on the to-be-optimized feature(s).

A decision 310 may be reached as to whether the determined cost is acceptable, or not, by comparing the determined cost to a specified value. If the cost, for example, is at or below a specified value, the to-be-optimized feature(s) may be considered to be sufficiently optimized, and the process may be terminated, block 311. When the cost, however, exceeds the specified value, the value(s) of the to-be-optimized feature(s) may be adjusted, and a further iteration of an optimization loop incorporating blocks 306, 307, 308, 309, and 310 may be performed.

Because of the relatively low computational intensity of the above described optimization loop, many iterations may be performed, by a processor, without significant cost or schedule penalties. The present inventor has found, for example, that a conventional work station may be employed to execute the optimization, such that 10,000-100,000 optimization cycles may be performed in a period of less than several days.

Figure 4:
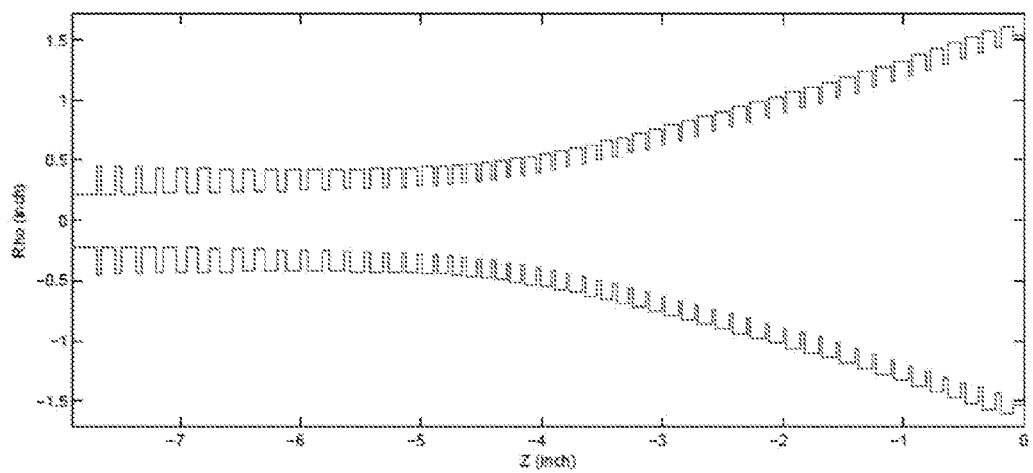
FIG. 4 illustrates embodiments of RF feed elements designed in a accordance with a disclosed technique.

Referring now to FIG. 4, a corrugated, axially symmetric, feed horn, designed using the above described techniques, is illustrated. The techniques may also be advantageously used to design smooth- and step-walled horns, non-axially symmetric horn, and, in fact, any type of RF feed element exhibiting primary pattern radiated fields for which a modal linear decomposition is possible.

Figure 5:
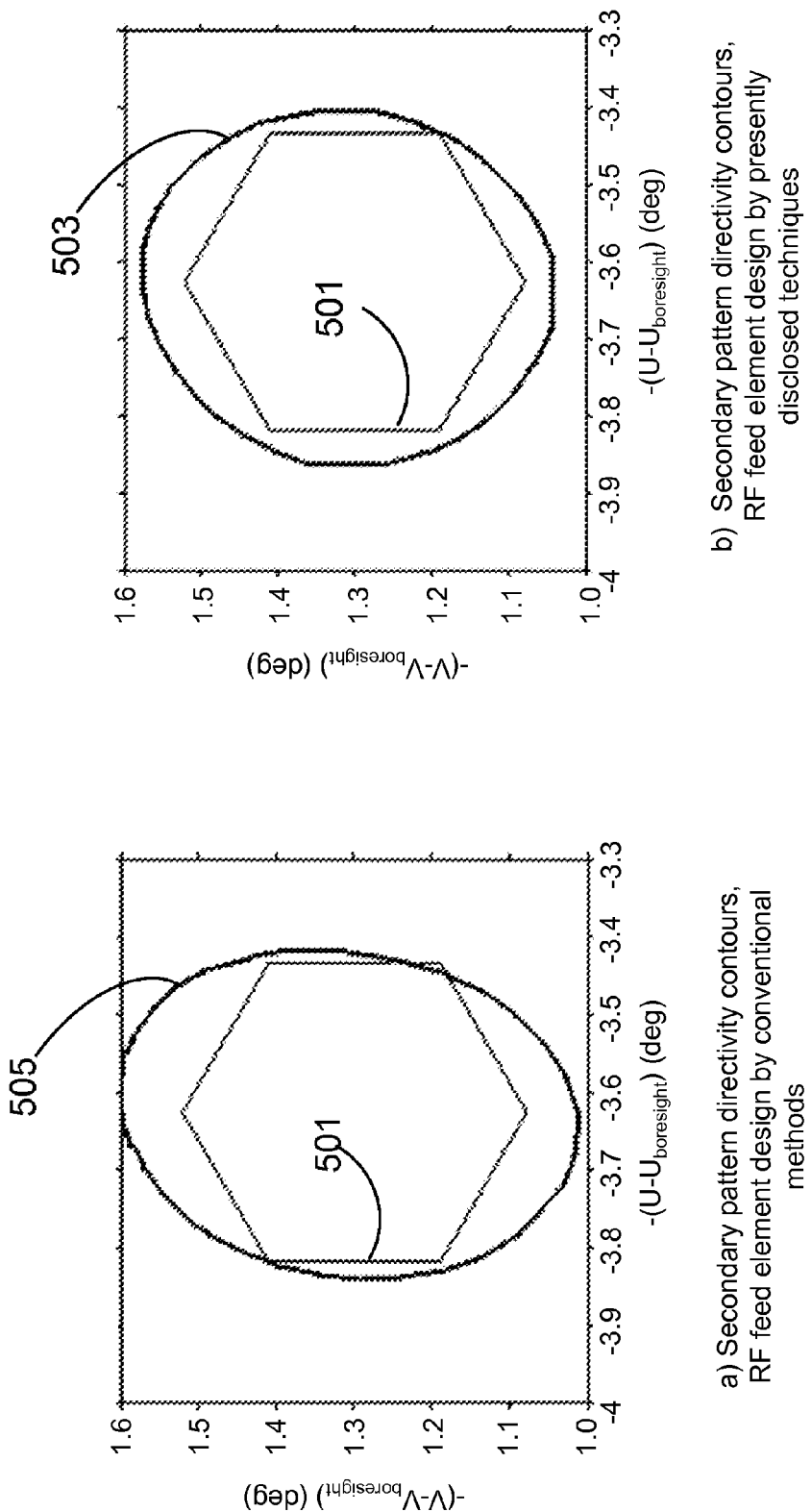
FIG. 5 illustrates performance features of an RF feed element designed in a accordance with a disclosed technique, compared to a conventional RF feed element design.

Referring now to FIG. 5, performance characteristics of a feed horn designed in accordance with the above described methods may be compared to performance characteristics of a feed horn designed according to conventional methods. Secondary pattern receive band contours at a level of 48.5 dBi are shown for a single offset reflector configuration Hexagonal polygon 501 represents the desired beam coverage area, and it is seen that the receive-band contour 503 illustrated in FIG. 5b (present methods) are more circular than the receive-band contour 505 illustrated in FIG. 5a (prior art), resulting in higher edge of coverage directivity and average directivity over the coverage area. Although the prior art design methods are, in principle, capable of achieving high performance RF feed elements, results in practice are highly dependent on the experience and judgment of the designer, as well as constraints on design time and cost. As a result, the present methods, as demonstrated in the example illustrated by FIG. 5, often achieve superior designs, as well as saving considerable time and labor.

Implementations of the subject matter described in this specification may be implemented as one or more computer programs, i.e., one or more modules of computer program instructions, encoded on a computer storage media for execution by, or to control the operation of, a data processing apparatus.

Thus, improved RF feed elements and techniques for designing them have have been disclosed, whereby the RF feed element is designed by performing a quantitative optimization of the RF feed element design directly with respect to specified secondary pattern characteristics of an antenna reflector.

The foregoing merely illustrates principles of the invention. It will thus be appreciated that those skilled in the art will be able to devise numerous systems and methods which, although not explicitly shown or described herein, embody the principles of the invention and are thus within the spirit and scope of the invention as defined by the following claims.

What is claimed is:

1. A method, pattern comprising:
    computing, for an antenna system, the antenna system including an RF feed element and a reflector, a plurality of partial secondary pattern complex field values for the reflector, each partial secondary pattern characteristic being associated with an individual RF feed element mode, wherein the RF feed element exhibits a plurality of primary pattern characteristics and is characterized by a first design feature, the first design feature being a geometric feature;
    storing the computed plurality of partial secondary pattern characteristics;
    optimizing a value of at least a second, to-be-optimized, design feature of the RF feed element, other than the first design feature, by executing, on a processor, at least two cycles of an optimization loop, the optimization loop comprising:
        (i) a determination of a cost for a current value of the second design feature, said cost resulting at least in part from a variance between a plurality of computed secondary pattern characteristics and a plurality of specified secondary pattern characteristics; and
        (ii) a decision block wherein, when the cost is not greater than a specified value, a first decision of the decision block is that the second design feature is sufficiently optimized, and, when the cost is greater than the specified value, a second decision of the decision block is to enter a step of adjusting the current value of the second design feature and repeat steps (i) and (ii);

wherein the computed secondary pattern characteristics are computed by performing a linear superposition on the stored computed plurality of partial secondary pattern complex field values, the linear superposition being performed using a set of complex modal coefficients of the RF feed element determined, for a selected number of radiating modes, taking into account the current value of the second design feature.

2. The method of claim 1, further comprising determining the set of complex modal coefficients of the RF feed element by performing an analysis of electromagnetic properties of the RF feed element.

3. The method of claim 2, wherein the analysis comprises at least one of: method of moments (MoM), finite difference time domain (FDTD), finite difference frequency domain (FDFD), finite elements (FE), and mode matching.

4. The method of claim 2, wherein the analysis comprises mode matching.

5. The method of claim 1, wherein the RF feed element is a horn.

6. The method of claim 5, wherein the horn has a longitudinal axis and a cross section of the horn is axially symmetric.

7. The method of claim 6, wherein the first geometric feature is a dimension of an aperture of the horn.

8. The method of claim 1, wherein the second feature is a geometric feature.

9. The method of claim 1, wherein the second design feature is other than a geometric feature.

10. The method of claim 1, wherein the reflector has a known set of optical properties, said known set of optical properties comprising at least one of a number of reflecting surfaces and a type of reflecting surface.

11. The method of claim 1, wherein computing a plurality of partial secondary pattern characteristics comprises:
selecting a set of optimization stations at locations within the secondary pattern coverage area of interest; and
computing, for each of the selected number of aperture modes, and at each optimization station, a respective partial secondary pattern, said computing step assuming a radiation pattern emitted from the RF feed element resulting only from excitation of a single respective mode.

12. The method of claim 11, wherein the selected number of aperture modes comprises substantially all propagating modes and at least one additional, cutoff, mode.

13. The method of claim 12, wherein the selected number of aperture modes comprises approximately twenty cutoff modes.

14. The method of claim 11, wherein computing a plurality of partial secondary pattern characteristics comprises integrating physical optics currents induced on a surface of the reflector.

15. The method of claim 11, wherein computing a respective partial secondary pattern comprises using at least one of: geometrical optics, physical optics, geometrical theory of diffraction (GTD) and physical theory of diffraction (PTD).

16. The method of claim 11, wherein each optimization station has a respective specification of at least one desired pattern characteristic.

17. The method of claim 11, wherein the computing step assumes a radiation pattern emitted from the RF feed element resulting only from excitation, with a unit excitation amplitude, of a respective single mode.

18. The method of claim 1, wherein the specified secondary pattern characteristics are selected from the group consisting of: effective isotropic radiated power (EIRP), gain to noise temperature ratio (G/T), edge of coverage directivity, side-lobe suppression, polarization, far field amplitude, polarization purity, ratio of desired polarization/cross polarization (C/X), and cross polarization and co-polarization roll-off.

19. The method of claim 1, wherein optimizing a value of the at least a second, to-be-optimized, feature of the RF feed element comprises executing, on the processor, at least one thousand cycles of the optimization loop.

20. The method of claim 1, wherein the cost results from a weighted sum of (i) the variance between the plurality of computed secondary pattern characteristics and the specified secondary pattern characteristics and (ii) a variance of at least one other property of the resulting feed geometry from a desired value.

21. The method of claim 20, wherein the at least one other property comprises at least one of feed return loss, physical length, and another property of interest that depends on the to-be-optimized feature.

22. An antenna system, comprising:
an RF feed element and a reflector, the RF feed element characterized by a first design feature, the first design feature being a geometric feature, and configured to exhibit a plurality of primary pattern characteristics, wherein:
the antenna system is required to comply with a plurality of specified secondary pattern characteristics; and
a second design feature of the RF feed element, other than the selected first design feature, results from performing a quantitative optimization of the second design feature directly with respect to the specified secondary pattern characteristics; wherein the quantitative optimization comprises:
computing a plurality of partial secondary pattern complex field values for the reflector, each partial secondary pattern characteristic being associated with an individual RF feed element mode;
storing the computed plurality of partial secondary pattern characteristics;
optimizing a value of the second design feature of the RF feed element by executing, on a processor, at least two cycles of an optimization loop, the optimization loop comprising:
(i) determining a cost for a current value of the second design feature, said cost resulting at least in part from a variance between a plurality of computed secondary pattern characteristics and the plurality of specified secondary pattern characteristics; and
(ii) determining, when the cost is not greater than a specified value, that the second design feature is sufficiently optimized, and, when the cost is greater than the specified value, adjusting the current value of the second design feature and repeating steps (i) and (ii); and
wherein the computed secondary pattern characteristics are computed by performing a linear superposition on the stored computed plurality of partial secondary pattern complex field values, the linear superposition being performed using a set of complex modal coefficients of the RF feed element determined, for a selected number of radiating modes, taking into account the current value of the second design feature.

23. The antenna system of claim 22, wherein the cost results from a weighted sum of (i) the variance between the plurality of computed secondary pattern characteristics and the specified secondary pattern characteristics and (ii) a variance of at least one other property of the resulting feed geometry from a desired value.

24. The antenna system of claim 23, wherein the at least one other property comprises at least one of feed return loss, physical length, and another property of interest that depends on the second design feature.

25. A non-transitory computer readable medium wherein computer instructions are stored, the instructions operable to cause a computer to perform steps of a method, the method comprising:
   computing, for an antenna system including an RF feed element and a reflector, a plurality of partial secondary pattern complex field values for the reflector, each partial secondary pattern characteristic being associated with an individual RF feed element mode, wherein the RF feed element exhibits a plurality of primary pattern characteristics and is characterized by a first design feature, the first design feature being a geometric feature;
   storing the computed plurality of partial secondary pattern characteristics;
   optimizing a value of at least a second, to-be-optimized, design feature of the RF feed element, other than the selected first design feature, by executing, on a processor, at least two cycles of an optimization loop, the optimization loop comprising:
   (i) a determination of a cost for a current value of the second design feature, said cost resulting at least in part from a variance between a plurality of computed secondary pattern characteristics and a plurality of specified secondary pattern characteristics; and
   (ii) a decision block wherein, when the cost is not greater than a specified value, a first decision of the decision block is that the second design feature is sufficiently optimized, and, when the cost is greater than the specified value, a second decision of the decision block is to enter a step of adjusting the current value of the second design feature and repeat steps (i) and (ii);
   wherein the computed secondary pattern characteristics are computed by performing a linear superposition on the stored computed plurality of partial secondary pattern complex field values, the linear superposition being performed using a set of complex modal coefficients of the RF feed element determined, for a selected number of radiating modes, taking into account the current value of the second design feature.

* * * * *